United States Patent
Bloemen et al.

(10) Patent No.: US 6,217,723 B1
(45) Date of Patent: Apr. 17, 2001

(54) METHOD OF MANUFACTURING A MULTILAYER FILM

(75) Inventors: Pascal J. H. Bloemen; Wilco Klaassens, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/320,807

(22) Filed: May 27, 1999

(30) Foreign Application Priority Data

May 28, 1998 (EP) .................................................. 98201781

(51) Int. Cl.$^7$ ...................................................... C23C 14/34
(52) U.S. Cl. ................ 204/192.23; 204/192.12; 204/192.2; 204/192.22
(58) Field of Search ........................... 204/192.12, 192.2, 204/192.22, 192.23

(56) References Cited

U.S. PATENT DOCUMENTS

| | | | |
|---|---|---|---|
| 4,894,133 | * 1/1990 | Hedgcoth | 204/192.15 |
| 5,049,209 | * 9/1991 | Sakikima et al. | 148/306 |
| 5,429,731 | 7/1995 | Osano et al. | 204/192 |
| 5,466,539 | 11/1995 | Takayama | 428/611 |

FOREIGN PATENT DOCUMENTS 2098112A   4/1990   (JP) .................. H01F/41/18

OTHER PUBLICATIONS

Vossen et al., "Thin Film Processes", pp. 48–49, Dec. 1978.*

* cited by examiner

*Primary Examiner*—Nam Nguyen
*Assistant Examiner*—Steven H. VerSteeg
(74) *Attorney, Agent, or Firm*—David R. Treacy

(57) ABSTRACT

In a method of manufacturing a multilayer film consisting of a stack of primary soft-magnetic layers and secondary non-magnetic layers on a substrate by way of reactive sputtering, use is made of one type of target at least as regards composition for alternately depositing a primary and a secondary layer, which target is particularly made of an FeHf alloy. For performing a sputtering process, use is preferably made of a gas mixture of Ar and $O_2$ in which the quantity of $O_2$ in the gas mixture is controllable and is smaller for sputtering the soft-magnetic layers than for sputtering the non-magnetic layers.

23 Claims, No Drawings

METHOD OF MANUFACTURING A MULTILAYER FILM

BACKGROUND OF THE INVENTION

The invention relates to a method of manufacturing a multilayer film consisting of a stack of primary soft-magnetic layers and secondary non-magnetic layers on a substrate by way of reactive sputtering.

Reactive sputtering is a technique which has been known for a long time, in which a target is bombarded with ions from a plasma which is generated by inserting a gas into a vacuum reactor vessel in which a substrate on which a layer must be provided is placed opposite the target, and by applying a high voltage which is negative with respect to the wall of the reactor vessel to the cathode formed by the target. The ions are thereby accelerated towards the target where cascade collisions are generated which result in an exiting of target material atoms located close to the surface. The direction of the particles thus sputtered with respect to the normal on the target surface is mainly cosine-distributed. It is common practice to use an inert gas such as Ar (or possibly, for example, Kr or Xe) in the reactor vessel, although also an active gas such as $N_2$, $O_2$ or $CH_4$ and the like may be used or added to the inert gas, dependent on specific applications.

This sputter-deposition technique is used, inter alia, for manufacturing multilayer films for magnetic heads. The multilayer film consists of a stack of primary soft-magnetic layers and secondary non-magnetic layers on a substrate. Particularly, the primary soft-magnetic layers have a thickness of the order of 0.1 to 10 µm and the secondary non-magnetic layers have a thickness of the order of 100 to 300 nm.

Examples of applying a soft-magnetic layer on a substrate by way of sputtering are given in, inter alia, U.S. Pat. No. 5,466,539. This patent states (in column 2, lines 64–67 and column 3, line 1) for example, a primary soft-magnetic layer which consists of an $Fe_xM_y$ alloy, in which M is at least one element of the group comprising inter alia Nb, Zr, Hf, Ti, Ta, Si and x is an atom percentage of approximately 90% and y is an atom percentage of approximately 10%, which soft-magnetic layer is provided by means of a gas mixture consisting of Ar with approximately 3% of $O_2$. The soft-magnetic layer mentioned in this U.S. patent has a thickness of 1.5 µm and is provided by way of sputtering with the aid of a plasma obtained from said gas mixture on a $SiO_2$ substrate which has a thickness of approximately 0.5 mm.

In the conventional manufacture of multilayer films for magnetic heads, sputtering techniques as described hereinbefore are used, in which the different composition of the primary soft-magnetic layer and the secondary non-magnetic layer is based on different targets. For example, it is known to use a CoZrNb target for the primary soft-magnetic layer and a $ZrO_2$ target for the non-magnetic layer. Thus, two targets having a different composition are used every time.

SUMMARY OF THE INVENTION

It is an object of the invention to improve the known method in this respect and provide the possibility of producing multilayer films at lower cost, particularly for magnetic heads.

In accordance with the invention, the method as described in the opening paragraph is therefore characterized in that use is made of one type of target at least as regards composition for alternately depositing a primary and a secondary layer. This means that either one target can be used for depositing both types of layers, or a plurality of targets having an identical or substantially identical composition can be used. In the latter case, use may be made of a known sputtering device for depositing the primary and secondary layers, in which device a plurality of targets is provided and in which a plurality of substrates is simultaneously provided with one of said layers.

Hitherto, these known sputtering devices have made use of targets which differ as far as composition is concerned, for example, a target consisting of an Fe alloy or the above-mentioned CoZrNb target for the soft-magnetic layers, and a target consisting of, for example $ZrO_2$ or $SiO_2$ for the non-magnetic layers. Since the substrates in these known sputtering devices are placed on a support which can be rotated underneath the relevant targets, a number of substrates can be alternately provided with soft-magnetic and non-magnetic layers in a continuous process. However, since the thickness of both types of layers varies quite considerably, the provision of notably a soft-magnetic layer will require much more time than the provision of a non-magnetic layer. After a non-magnetic layer has been deposited, a relatively long waiting time is thus to be observed, namely until also the soft-magnetic layer has been deposited, before the supports can be rotated underneath a different target where they can be sputtered with a layer having a different composition.

However, if all targets have the same composition, the support in the known sputtering device does not need to be rotated, and a number of substrates can be sputtered simultaneously in this device alternately with a soft-magnetic layer and a non-magnetic layer. For sputtering the alternate layers simultaneously, the composition of the gas mixture is then to be adapted synchronously; this will be elucidated hereinafter. By using only one type of target as far as composition is concerned, waiting times in the production of multilayer films can be prevented in the known sputtering device.

According to the invention, the target may be composed of an $Fe_xM_y$ or a $Co_xM_y$ alloy, in which M is at least one element selected from the group comprising Nb, Zr, Hf, Ti, Ta, and Si, and x is an atom percentage of at least 80.

It may be advantageous in the known sputtering devices to rotate the support in the case of parallel production of multilayer films in spite of the fact that all targets are identical. Since a certain inhomogeneous distribution is inherent in the sputtering process, the thickness of the layer to be provided may exhibit differences and variations. By rotating the support, such differences and variations in the layer thickness can be averaged.

As already noted, it is essential for the present invention that both a soft-magnetic and a non-magnetic layer can be provided from one target. The following description will be based on a target which is composed of an $Fe_xM_y$ alloy, in which M is at least one element of the group comprising, inter alia, Co, Nb, Zr, Hf, Ti, Ta, Si, and, for describing a specific embodiment, an FeHf alloy in which the atom percentage of Fe is at least 80% and preferably 90%. The plasma used in the sputtering device is obtained from a mixture of an inert gas such as Ar, although, for example also Kr or Xe could be used, and a gas from the group of active gases constituted, inter alia, by $O_2$, $N_2$, $CH_4$; however, the description of a specific embodiment is based on a mixture of Ar and $O_2$. The inert gas is used in the sputtering device for releasing particles from the target, while the addition thereto is bound with the atoms on the surface of the target and the substrate and, for only a very small part, with the particles released from the target in so far as they have not been bound by the addition.

To be able to deposit both a soft-magnetic layer and a non-magnetic layer from one type of target, the mixing ratio of the gas and, in the specific embodiment, the percentage of $O_2$ in the gas mixture will be different for depositing the different layers; particularly, the quantity of $O_2$ in the gas mixture is controllable in the specific embodiment. The percentage of $O_2$ may, in principle, be controlled to such an extent that pure Ar can be used for depositing a soft-magnetic layer and pure $O_2$ can be used for depositing a non-magnetic layer. In any case, the percentage of $O_2$ in the gas mixture is smaller for sputtering a soft-magnetic layer than for sputtering a non-magnetic layer. The quantity of $O_2$ in the gas mixture can be controlled at the location of the plasma. It is alternatively possible to prepare the desired gas mixtures of Ar and $O_2$ in advance.

When sputtering a non-magnetic layer from an FeHf target in a plasma comprising a relatively large percentage of $O_2$, a non-magnetic layer of Fe and Hf oxides is formed. If, instead of being mixed with $O_2$, the inert gas were mixed with a relatively large percentage of $N_2$ or $CH_4$, non-magnetic layers of Fe and Hf nitrides or carbides would be deposited.

When sputtering a soft-magnetic layer from an FeHf target, a relatively small quantity of $O_2$ or no $O_2$ is used; mainly, only the Hf will be bound with it due to its affinity for $O_2$ which is greater than for Fe. When the percentage of $O_2$ in the gas mixture increases, the resistance of the relevant layer will, however, increase rapidly.

When a multilayer film consisting of a number of soft-magnetic layers alternating with a number of non-magnetic layers, for example, a number of ten layers each is obtained by means of said sputter-deposition technique, the packets obtained can be provided onto one another with a bonding layer in such a way that the packet of layers is located between two substrates, in which case the magnetic head obtained is referred to as sandwich magnetic head. The magnetic head obtained may be used in all types of known devices for recording and/or reproducing information.

What is claimed is:

1. A method of manufacturing a multilayer film consisting of a stack of at least one primary soft-magnetic layer and at least one secondary non-magnetic layer on a substrate, comprising the steps of:

providing a substrate on which said layers are to be deposited, providing a target having a single given composition for alternately depositing said at least one primary layer and said at least one secondary layer, sputtering to deposit said at least one primary layer by a reactive sputtering process in the presence of a first gas, and sputtering to deposit said at least one secondary layer by a reactive sputtering process in the presence of a second gas different from said first gas, characterized in that said first gas comprises an inert gas and no more than a first percentage of an active gas, and said second gas comprises a second percentage of active gas greater than said first percentage.

2. A method as claimed in claim 1, characterized in that said target is composed of an $Fe_xM_y$ or a $Co_xM_y$ alloy, in which M is at least one element selected from the group consisting of Nb, Zr, Hf, Ti, Ta, and Si, and x is an atom percentage of at least 80.

3. A method as claimed in claim 1, wherein said stack includes a plurality of primary soft-magnetic layers alternating with respective ones of a plurality of secondary non-magnetic layers, characterized in that said stack is deposited using one target only.

4. A method as claimed in claim 3, characterized in that said target is composed of an $Fe_xM_y$ or a $Co_xM_y$ alloy, in which M is at least one element selected from the group consisting of Nb, Zr, Hf, Ti, Ta, and Si, and x is an atom percentage of at least 80.

5. A method as claimed in claim 4, for simultaneously manufacturing a plurality of said films, each consisting of a respective stack on a respective substrate, characterized in that:

sputtering is performed in a sputtering apparatus, said apparatus including a corresponding plurality of said targets, each of said targets having an at least substantially identical composition, and each of the respective substrates is simultaneously provided with a respective one of said layers.

6. A method as claimed in claim 5, characterized in that the method further comprises:

placing said substrates on a support, and moving said support relatively with respect to said plurality of targets.

7. A method of manufacturing a multilayer film consisting of a stack of at least one primary soft-magnetic layer and at least one secondary non-magnetic layer on a substrate, comprising the steps of:

providing a substrate on which said layers are to be deposited, providing a target having a single given composiition for alternately depositing said at least one primary layer and said at least one secondary layer, sputtering to deposit said at least one primary layer by a reactive sputtering process in the presence of a first gas, and sputtering to deposit said at least one secondary layer by a reactive sputtering process in the presence of a second gas different from said first gas, characterized in that said target is composed of an $Fe_xM_y$ or a $Co_xM_y$ alloy, in which M is at least one element selected from the group consisting of Nb, Zr, Hf, Ti, Ta, and Si, and x is an atom percentage of at least 80, said first gas comprises an inert gas selected from the group consisting of Ar, Kr and Xe and no more than a first percentage of an active gas selected from the group consisting of $O_2$, $N_2$ and $CH_4$, and said second gas comprises a second percentage of said active gas greater than said first percentage.

8. A method as claimed in claim 7, characterized in that said second gas consists of said inert gas and said active gas.

9. A method as claimed in claim 7, wherein said stack includes a plurality of primary soft-magnetic layers alternating with respective ones of a plurality of secondary non-magnetic layers, characterized in that said stack is deposited using one target only.

10. A method as claimed in claim 9, characterized in that said target is composed of an $Fe_xHf_y$ alloy, in which x is an atom percentage of at least 80.

11. A method as claimed in claim 10, characterized in that said target is composed of an $Fe_xHf_y$ alloy, in which x is an atom percentage of at least 90.

12. A method as claimed in claim 9, for simultaneously manufacturing a plurality of said films, each consisting of a respective stack on a respective substrate, characterized in that:

sputtering is performed in a sputtering apparatus, said apparatus including a corresponding plurality of said targets, each of said targets having an at least substantially identical composition, and each of the respective substrates is simultaneously provided with a respective one of said layers.

13. A method as claimed in claim 12, characterized in that the method further comprises:

placing said substrates on a support, and moving said support relatively with respect to said plurality of targets.

14. A method of manufacturing a multilayer film consisting of a stack of at least one primary soft-magnetic layer and at least one secondary non-magnetic layer on a substrate, comprising the steps of:

providing a substrate on which said layers are to be deposited, providing a target having a single given composition for alternately depositing said at least one primary layer and said at least one secondary layer, sputtering to deposit said at least one primary layer by a reactive sputtering process in the presence of a first gas, and sputtering to deposit said at least one secondary layer by a reactive sputtering process in the presence of a second gas different from said first gas, characterized in that said target is composed of an $Fe_xM_y$ or a $Co_xM_y$ alloy, in which M is at least one element selected from the group consisting of Nb, Zr, Hf, Ti, Ta, and Si, and x is an atom percentage of at least 80, said first gas consists of an inert gas selected from the group consisting of Ar, Kr and Xe and no more than a first percentage of $O_2$, and said second gas comprises a second percentage of $O_2$ greater than said first percentage.

15. A method as claimed in claim 14, characterized in that said second gas consists of $O_2$.

16. A method as claimed in claim 14, wherein said stack includes a plurality of primary soft-magnetic layers alternating with respective ones of a plurality of secondary non-magnetic layers, characterized in that said stack is deposited using one target only.

17. A method as claimed in claim 16, for simultaneously manufacturing a plurality of said films, each consisting of a respective stack on a respective substrate, characterized in that:

sputtering is performed in a sputtering apparatus, said apparatus including a corresponding plurality of said targets, each of said targets having an at least substantially identical composition, and each of the respective substrates is simultaneously provided with a respective one of said layers.

18. A method as claimed in claim 17, characterized in that the method further comprises:

placing said substrates on a support, and moving said support relatively with respect to said plurality of targets.

19. A method as claimed in claim 14, characterized in that said first gas is argon, and said target is composed of an $Fe_xHf_y$ alloy, in which x is an atom percentage of at least 80.

20. A method as claimed in claim 19, characterized in that x is an atom percentage of at least 90.

21. A method as claimed in claim 20, wherein said stack includes a plurality of primary soft-magnetic layers alternating with respective ones of a plurality of secondary non-magnetic layers, characterized in that said stack is deposited using one target only.

22. A method as claimed in claim 21, for simultaneously manufacturing a plurality of said films, each consisting of a respective stack on a respective substrate, characterized in that:

sputtering is performed in a sputtering apparatus, said apparatus including a corresponding plurality of said targets, each of said targets having an at least substantially identical composition, and each of the respective substrates is simultaneously provided with a respective one of said layers.

23. A method as claimed in claim 22, characterized in that the method further comprises:

placing said substrates on a support, and moving said support relatively with respect to said plurality of targets.

* * * * *